United States Patent
Lin et al.

(10) Patent No.: US 9,761,707 B1
(45) Date of Patent: Sep. 12, 2017

(54) LATERALLY DIFFUSED MOSFET WITH ISOLATION REGION

(71) Applicant: Freescale Semiconductor, Inc., Austin, TX (US)

(72) Inventors: Xin Lin, Phoenix, AZ (US); Ronghua Zhu, Chandler, AZ (US); Hongning Yang, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/242,322

(22) Filed: Aug. 19, 2016

(51) Int. Cl.
  *H01L 29/78* (2006.01)
  *H01L 29/10* (2006.01)
  *H01L 27/06* (2006.01)
  *H01L 29/06* (2006.01)

(52) U.S. Cl.
  CPC ...... *H01L 29/7823* (2013.01); *H01L 27/0629* (2013.01); *H01L 29/0634* (2013.01); *H01L 29/0649* (2013.01); *H01L 29/1087* (2013.01)

(58) Field of Classification Search
  CPC ............. H01L 29/0634; H01L 29/7823; H01L 29/0649
  See application file for complete search history.

(56) References Cited

U.S. PATENT DOCUMENTS

| | | | |
|---|---|---|---|
| 6,882,023 B2 | 4/2005 | Khemka et al. | |
| 8,338,872 B2 | 12/2012 | Khemka et al. | |
| 8,344,472 B2 | 1/2013 | Khemka et al. | |
| 8,541,862 B2 | 9/2013 | Yang et al. | |
| 9,306,060 B1 | 4/2016 | Yang et al. | |
| 9,508,845 B1* | 11/2016 | Lin | H01L 29/66659 |
| 2008/0182394 A1 | 7/2008 | Yang et al. | |
| 2010/0038718 A1 | 2/2010 | Zhu et al. | |
| 2011/0057262 A1 | 3/2011 | Ma et al. | |
| 2011/0241092 A1 | 10/2011 | Khemka et al. | |
| 2013/0134511 A1 | 5/2013 | Yang et al. | |
| 2013/0270606 A1 | 10/2013 | Chen et al. | |
| 2013/0341730 A1 | 12/2013 | Domanski | |
| 2014/0339637 A1 | 11/2014 | Jang | |
| 2015/0236087 A1 | 8/2015 | Chang et al. | |
| 2016/0043217 A1 | 2/2016 | Cai | |
| 2016/0181421 A1 | 6/2016 | Yang et al. | |
| 2017/0077219 A1 | 3/2017 | Yang et al. | |
| 2017/0077295 A1 | 3/2017 | Yang et al. | |

OTHER PUBLICATIONS

Restriction Requirement dated Aug. 1, 2016 for U.S. Appl. No. 14/851,360, 5 pages.

(Continued)

*Primary Examiner* — Amar Movva

(57) ABSTRACT

A device formed in a semiconductor substrate is disclosed. The device include a core device formed in the semiconductor substrate, a first deep trench isolation barrier surrounding the core device and a secondary device formed in the semiconductor substrate outside the deep trench isolation barrier. The device also includes a second deep trench isolation barrier formed to isolate the secondary device from remaining part of the semiconductor substrate. A first portion of the secondary device is electrically connected to a first portion of the core device through a first electrical connector and a second portion of the secondary device is electrically connected to a second portion of the core device through a second electrical connector.

20 Claims, 5 Drawing Sheets

(56) References Cited

OTHER PUBLICATIONS

Non-Final dated Nov. 10, 2016 for U.S. Appl. No. 14/851,360, 16 pages.
Final Office Action dated Mar. 20, 2017 for U.S. Appl. No. 14/851,360, 26 pages.
Non-final dated Jul. 12, 2017 for U.S. Appl. No. 14/851,360, 24 pages.

* cited by examiner

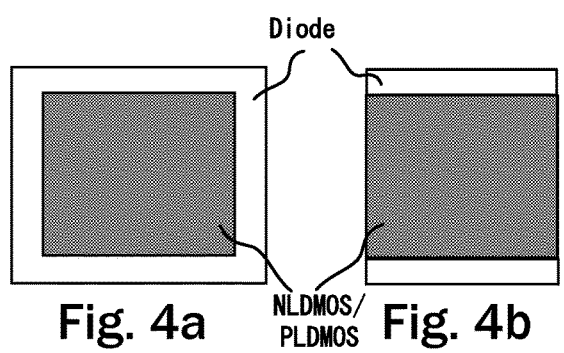
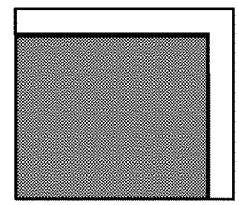
Fig. 4a  Fig. 4b  Fig. 4c
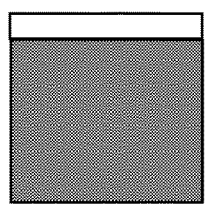
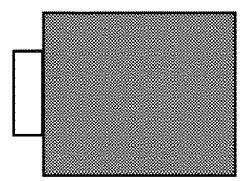
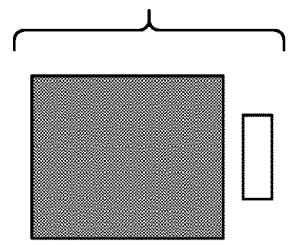
Fig. 4d  Fig. 4e  Fig. 4f
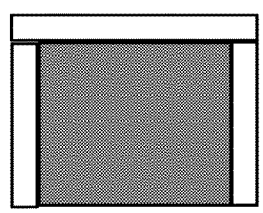
Fig. 4g

LATERALLY DIFFUSED MOSFET WITH ISOLATION REGION

DESCRIPTION OF THE RELATED ART

This application is related to application Ser. No. 14/851,360 filed on Sep. 11, 2015 entitled "Partially Biased Isolation in Semiconductor Devices.

BACKGROUND

Insulated gate field effect transistor (IGFET) devices are widely used in modern electronic applications. Metal-oxide-semiconductor field effect transistor (MOSFET) devices and lateral-(double)-diffused-metal-oxide-semiconductor (LDMOS) devices are well known examples of such IGFET devices. The term metal-oxide-semiconductor and the abbreviation MOS are to be interpreted broadly. In particular, it should be understood that they are not limited merely to structures that use "metal" and "oxide", but may employ any type of conductor, including "metal", and any type of dielectric, including "oxide". The term field effect transistor is abbreviated as "FET". It is known that improved performance of LDMOST devices can be obtained by using reduced surface field (RESURF) structures.

Power transistor devices are designed to be tolerant of the high currents and voltages that are present in power applications such as motion control, air bag deployment, and automotive fuel injector drivers. One type of power MOS transistor is a laterally diffused metal-oxide-semiconductor (LDMOS) transistor. In an LDMOS device, a drift space is provided between the channel region and the drain region.

LDMOS devices may be designed to operate in a high-side configuration in which all of the device terminals are level shifted with respect to the substrate potential. Devices configured for high-side operation have been applied in power switchers in DC-to-DC converters, which have respective LDMOS devices for the high side and low side. High-side capable devices are designed to prevent a direct forward bias or punch-through path from a body region of the LDMOS device to an underlying substrate.

LDMOS devices are often used in applications, such as automotive applications, involving operational voltages greater than 40 volts. Breakdown resulting from applying such high voltages to the drain is often prevented through a reduced surface field (RESURF) structure in the LDMOS device design. The RESURF structure is designed to deplete the drift space of the LDMOS device in both vertical and lateral directions, thereby reducing the electric field near the surface at the drift region and thus improving the off-state breakdown voltage (BVdss) of the device.

Some LDMOS devices have a "double RESURF" structure. For example, in n-channel LDMOS devices, the drift space contains an upper level n-type region and a lower level p-type region, with an n-type buried isolation layer beneath the p-type region. The double nature of the structure refers to the depletion of the two regions and the reduction of the electric field in the related junction areas. Double RESURF structures typically apply the drain voltage to isolation regions in order to deplete the both the n-type and p-type regions.

However, biasing the isolation regions at the drain voltage increases the field stress between the body of the LDMOS device and a buried isolation layer. Breakdown may instead occur between the body and the buried isolation layer, thereby limiting the breakdown voltage. Previous efforts to address such source/body-based breakdown have introduced fabrication challenges or degraded the electrostatic discharge (ESD) and safe operating area (SOA) performance of the device. Improvements have been devised to achieve high breakdown voltage and good SOA performance. Despite improvements, the device has a relative high current gain in the parasitic bipolar transistor formed by the p-type device body, n-type isolation ring, and p-type substrate. As a result, a large substrate current has been detected during the circuit switch while the inductive component in the circuit brings a negative potential on the source/body terminal.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

In one embodiment, a device formed in a semiconductor substrate is disclosed. The device include a core device formed in the semiconductor substrate, a first deep trench isolation barrier surrounding the core device and a secondary device formed in the semiconductor substrate outside the deep trench isolation barrier. The device also includes a second deep trench isolation barrier formed to isolate the secondary device from remaining part of the semiconductor substrate. A first portion of the secondary device is electrically connected to a first portion of the core device through a first electrical connector and a second portion of the secondary device is electrically connected to a second portion of the core device through a second electrical connector.

In another embodiment, a device formed in a semiconductor substrate is disclosed. The device includes a doped isolation barrier disposed in the semiconductor substrate and defining a core device area within the doped isolation barrier. The device further includes an isolation contact region disposed in the semiconductor substrate outside of the core device area and to which a voltage is applied during operation and a depleted well region disposed in the semiconductor substrate outside of the core device area, the depleted well region electrically coupling the isolation contact region and the doped isolation barrier such that the doped isolation barrier is biased at a voltage level lower than the voltage applied to the isolation contact region. The doped isolation barrier includes a first doped isolation barrier and a second isolation barrier separated by one or multiple deep trench isolation region(s). The first doped isolation barrier and the second isolation barrier are electrically connected using a metal line disposed over a surface of the semiconductor substrate.

In some embodiments, a passivation layer is disposed over a top surface of the semiconductor substrate. The first electrical connector and the second electrical connector are disposed over within the passivation layer. A doped isolation barrier is disposed on a first and a second sides of the first deep trench isolation barrier. The doped isolation barrier includes a first doped isolation barrier disposed on the first side of the first deep trench isolation barrier and a second doped isolation barrier disposed on the second side of the first deep trench isolation barrier. The first doped isolation barrier and the second doped isolation barrier are electrically connected through the first electrical connector. The secondary device is disposed such that the secondary device surrounds the core device in all sides. The secondary device includes a first part and a second part, wherein the first part is disposed on a first side of the core device and the second part is disposed on a second side of the core device. In another embodiment, the secondary device is disposed on one side the core device. In yet another embodiment, the secondary device includes a first part, a second part and a third part, wherein the first part is disposed on a first side of the core device, the second part is disposed on a second side of the core device and the third part is disposed on a third side of the core device.

In some embodiments, the core device is a transistor and the secondary device is a diode and the core device is configured to have a breakdown voltage over 50 volts.

In some embodiments, the device further comprises a conductive flap supported by the semiconductor substrate and positioned over the depleted well region, the conductive flap being biased during operation to deplete the depleted well region. The depleted well region comprises a pair of exterior sections between the isolation contact region and the doped isolation barrier, and an interior section disposed between the exterior sections. The depleted well region may comprise a pair of interior sections adjacent the isolation contact region, a pair of exterior sections sitting outside of the interior sections. In one embodiment, a body region disposed in the semiconductor substrate within the core device area, having a first conductivity type, and in which a channel is formed during operation. A drift region is disposed in the semiconductor substrate within the core device area, having a second conductivity type, and through which charge carriers drift during operation after exiting the channel. The depleted well region has a dopant concentration profile in common with either the body region or the drift region. In one embodiment, the device further comprising a buried well region disposed under and in contact with the depleted well region. The depleted well region has a first or a second conductivity type and the buried well region has a first or a second conductivity type. For n-channel transistor (depicted in FIG. 2), the depleted well region has the second conductivity type and the buried well region has the first conductivity type. In contrast, for p-channel transistor (depicted in FIG. 3), the depleted well region has the first conductivity type and the buried well region has the second conductivity type. A body region is disposed in the semiconductor substrate within the core device area, having a first conductivity type, and in which a channel is formed during operation and a drift region is disposed in the semiconductor substrate within the core device area, having a second conductivity type, and through which charge carriers drift during operation after exiting the channel. A further buried well region is disposed in the semiconductor substrate under and in contact with the drift region, having the first conductivity type, and configured to deplete the drift region. For p-channel transistor (depicted in FIG. 3), the buried isolation layer, a part of isolation ring, sits below the drift region to help the depletion of the drift region. For n-channel transistor (depicted in FIG. 2), the depleted well region and the drift region have a common dopant concentration profile. The buried well region and the further buried well region have a common or similar dopant concentration profile. The depleted well region does not extend across an entire lateral extent of the isolation contact region.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments. Advantages of the subject matter claimed will become apparent to those skilled in the art upon reading this description in conjunction with the accompanying drawings, in which like reference numerals have been used to designate like elements, and in which:

FIG. 4a-4g depict relative locations of LDMOS and Diode in the improved LDMOS in accordance with one of more embodiments of the present disclosure.

Note that figures are not drawn to scale. Intermediate steps between figure transitions have been omitted so as not to obfuscate the disclosure. Those intermediate steps are known to a person skilled in the art.

DETAILED DESCRIPTION

It should be noted that the embodiments described herein use n-channel LDMOS for example only. A person skilled in the art would realize that these embodiments can also be applied for p-channel LDMOS. Many well-known steps and components have been omitted from the description so as not to obfuscate the present disclosure.

Embodiments of laterally diffused metal oxide semiconductor (LDMOS) and other power transistor devices and electronic apparatus with partially biased isolation are described.

Figure 1:
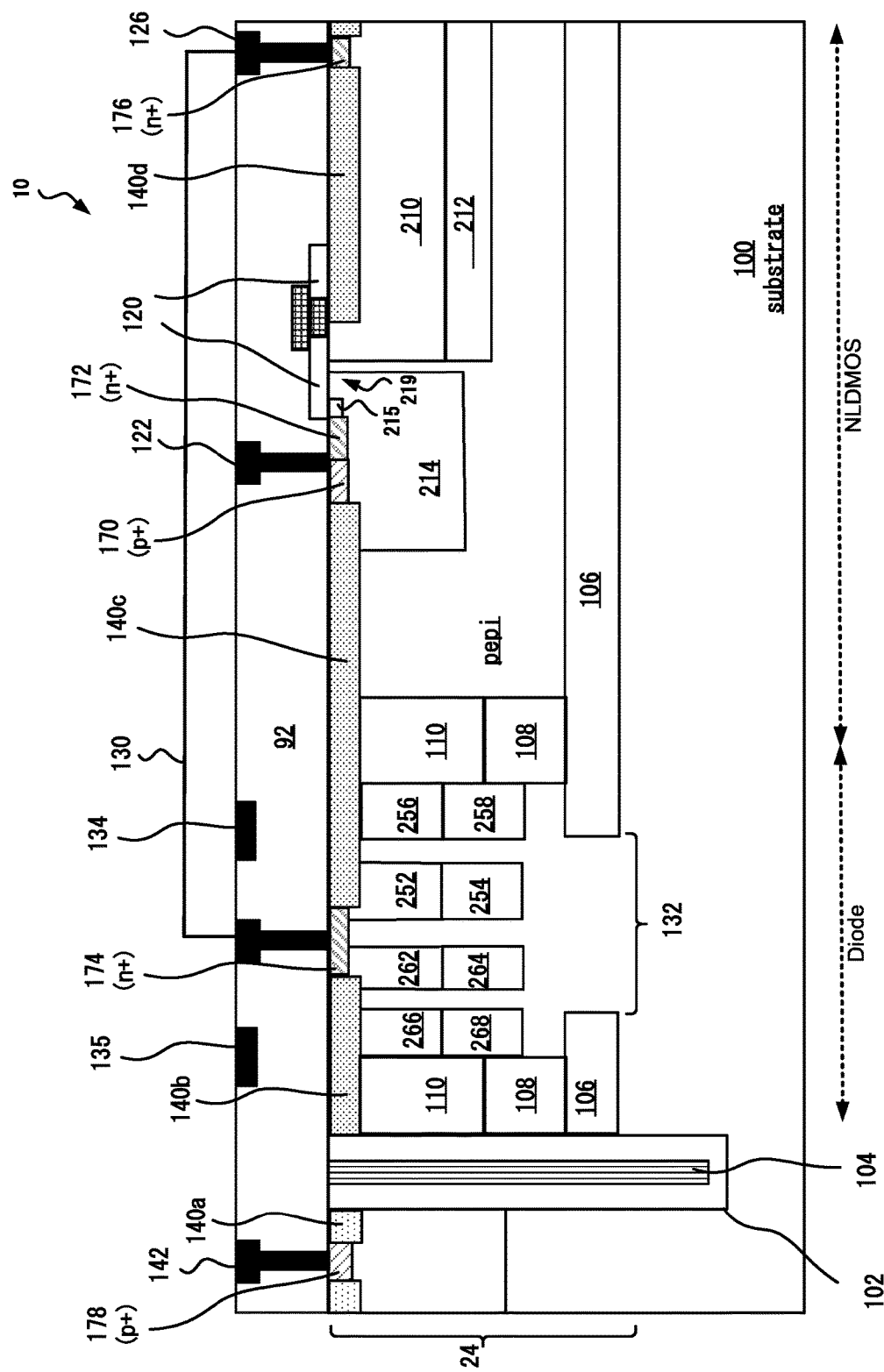
FIG. 1 depicts a schematic of a n-channel LDMOS (NLDMOS)

FIG. 1 is a schematic cross-sectional view of an example of a device 10. In this embodiment, the device 10 is configured as an n-channel device. The device 10 may be configured as a Reduced Surface Field (RESURF) transistor. In this example, the device 10 has a double RESURF arrangement.

The device 10 includes a semiconductor substrate 100, which may, in turn, include a number of epitaxial layers 24. The substrate 100 may be a lightly doped p-type substrate in some cases, such as those having multiple epitaxial layers. A heavily doped p-type substrate may also be used in some embodiments. The substrate 100 may be biased via a substrate contact region 178. The connector 142 provides a mean for connecting the substrate contact region 178 to external circuit, if needed. The device 10 may alternatively or additionally include non-epitaxial layers in which one or more device regions are formed.

Isolation regions may be partially lifted to a bias voltage level using a well region 132 that couples the isolation regions to an isolation contact region. The well region is positioned and otherwise configured to be depleted of charge carriers. As a result, some of the bias voltage applied to the isolation contact region is sustained across the depleted well region. Only a portion of the bias voltage is therefore passed on to the isolation regions. The depleted well region 132 thus provides partial biasing, or lifting of the isolation potential.

The partial lifting of the isolation potential avoids biasing the isolation regions at voltage levels that would otherwise establish the breakdown voltage level of the device. With significantly less voltage stress between the device body and the isolation regions, breakdown voltage levels (e.g., Drain-Source-Breakdown Voltage (BVDSS) levels) up to, for instance, 100 Volts or beyond may be achieved.

The depleted well region 132 is incorporated into a periphery of NLDMOS, rather than in the core device area. The peripheral location may be useful because, for large power devices, the size of the peripheral areas of the devices is relatively negligible. As a result, the overall increase in device size is negligible. Performance parameters related to device size, such as resistance, are thus not significantly affected.

Another depleted well region may be used to partially bias isolation regions adjacent a deep trench isolation (DTI) region 102. Additional breakdown protection for the DTI region may thus be provided. In some cases, the depleted well regions are disposed in a laterally symmetrical arrangement about the isolation contact region, in which case the same amount of bias voltage is sustained. In other cases, the depleted well region protecting the DTI region may be different such that more or less voltage stress is placed on the DTI region.

The depleted well region 132 may be formed in both n-channel and p-channel devices. The method embodiments may form the depleted well region using an implant directed to forming a drift region (e.g., n-channel devices with a p-type body) or a body region (e.g., p-channel devices with an n-type body). Other regions may also be formed using available implants. For instance, a buried well region used to deplete the depleted well region may be configured to form a Reduced Surface Field (RESURF) region used to deplete a drift region of an n-channel LDMOS device. Increases in fabrication costs may thus be avoided.

In some embodiments, one or more aspects of the device in the core device area are configured to support the partial biasing of the isolation regions. For instance, in devices in which the device body and the isolation regions have the same conductivity type (e.g., p-channel devices with a n-type body), the device body may be electrically isolated from the isolation regions within the core device area. The device body may be surrounded by a number of oppositely doped, buried wells. One or more of the buried wells may be formed using an implant directed to forming other device regions, such as the implant that forms the buried well regions used to deplete both the depleted well region for partial biasing of the isolation regions and the drift region of, e.g., an n-channel LDMOS device with a p-type body.

Any one or more of the layers of the semiconductor substrate 100 may include silicon. Alternative or additional semiconductor materials may be used in other embodiments. The structural, material, and other characteristics of the semiconductor substrate 100 may vary from the example shown. Although useful for increasing the breakdown voltage in connection with bulk substrates, the disclosed embodiments are not limited to bulk substrates. For example, the semiconductor substrate 100 may be or include a silicon-on-insulator (SOI) substrate. Additional, fewer, or alternative layers may be included in the semiconductor substrate 100. For example, any number of additional semiconductor and/or non-semiconductor layers may be included. The disclosed devices are thus not limited to, for instance, bulk silicon substrates or substrates including epitaxially grown layers, and instead may be supported by a wide variety of other types of semiconductor substrates. Note that components in Figures are not drawn to scale.

The device 10 is laterally isolated from a remainder of the substrate 100 by a deep-trench isolation (DTI) barrier 102 composed of a heavily n-type doped polysilicon 104 enclosed in a dielectric. A doped isolation barrier is provided for further device isolation. The doped isolation barrier includes isolation wells 108, 110. The isolation well 108 is in contact with a buried isolation layer 106 to electrically connect the doped isolation barrier for the device 10. One or more of the doped isolation layers and regions may be replicated along the DTI ring 102 to provide further isolation.

The doped isolation barrier defines a core device area (marked as NLDMOS) of the device 10. The core device area may correspond with the area in which the active components of the device 10 are disposed. The buried isolation layer 106 extends across the entire lateral extent of the core device area. The lateral extent of the core device area is defined in this example by the isolation wells 110, 108. The isolation wells 110, 108 may thus be ring-shaped to laterally surround the core device area. The buried isolation layer 106 may be formed in the semiconductor substrate 100 before the growth of the epitaxial layers.

One or more of the layers and regions of the doped isolation barrier may have a dopant concentration level and/or be otherwise configured for high voltage (HV) operation (e.g., high side operation in which the terminals of the device 10 are level shifted relative to the semiconductor substrate 100, which may be grounded). For example, the higher dopant concentration level of the isolation barrier layer may be useful in preventing punch-through. Any number of the device isolation wells, sinks, or buried layers may or may not be connected to one another. Additional, fewer, or alternative device isolation layers or regions may be provided in the semiconductor substrate 100.

Within the core device area, the device 10 includes a source region 172, a drain region 176, a body region 214 in which the source region 172 is disposed, and a drift region 210 in which a drain region 176 is disposed. The drain region 176 is connected to a drain connector 126. In this example, the body region 214 is a p-type well. The drift region 210 (n-type) is formed over a buried well region 212 (p-type). The drift region 210 and the buried well region 212 are doped using a same mask. In another embodiment, they are formed by the implants using different masks. The body region 214 may be biased via one or more heavily doped p-type body contact regions or electrodes 170 formed in or otherwise above the p-type well of the body region 214. The dopant concentration of each contact region 170 may be at a level sufficient to establish an ohmic contact to the body region 214.

The source and drain regions 172 and 176 are laterally spaced from one another in the lateral dimension shown in the cross-section of FIG. 1. Any number of source or drain regions 172, 176 may be provided. The drain region 176 need not be centered or otherwise disposed between, or laterally surrounded by, the source region 172 as shown. In this example, the source and drain regions 172 and 176 are heavily doped n-type portions of the epitaxial layer 24. The heavily doped n-type source region 172 is disposed within, on, and/or otherwise above the body region 214. The heavily doped n-type drain region 176 is spaced from the body region 214 along the lateral dimension shown in FIG. 1. Such spacing defines a conduction path of the device between the source and drain regions 172 and 176. The regions 172, 176, or a portion thereof, may have a dopant concentration at a level sufficient to establish ohmic contacts for biasing the source region 172 and the drain region 176. In this n-channel LDMOS configuration, the drain region 176 is biased at a relatively high drain voltage relative to the source region 172. Note that the doping types, source, drain, gates and their configurations will be different in case of a p-channel device and will be well known within the knowledge of a person skilled in the art.

The device 10 includes one or more gate structures 120 formed on or above the epitaxial layer 24. The gate structure 120 is disposed between the source region 172 and the drain region 176. In some embodiments, the gate structure 120 surrounds the drain region 176, which may be centrally or internally disposed within the core device area. Alternatively, the gate structure 120 may be arranged in a dual gate finger configuration in which two transistors are symmetrically arranged to share the same drain region 176. The gate structure 120 includes a polysilicon or other conductive plate located on or above a gate dielectric. For example, the gate dielectric may include silicon dioxide (or oxide) deposited or otherwise formed on the epitaxial layer 24 (i.e., the surface of the substrate 100). The gate structure 120 may include one or more dielectric sidewall spacers (not shown) disposed along lateral edges of the gate structure 120. The sidewall spacers may cover the lateral edges to act as a silicide blocker to prevent a silicide short along the surface of the substrate 100. The sidewall spacers may provide spacing to separate the conductive components of the gate structure 120 from the source region 172 and other regions of the device 10. In this example, one of the sidewall spacers is used for alignment purposes in defining an edge of the source region 172.

The configuration of the gate structure 120 may vary. The configuration of the gate structure 120 may include multiple conductive layers (e.g., polysilicon plates and metal plates). The components, materials, and other characteristics of the gate structure 120 may vary from the example shown.

As shown, a number of shallow trench isolation (STI) regions 140a-d may be formed. In this embodiment, a STI region 140d is disposed between the source region 172 and the drain region 176 to protect the gate structure 120 from the high voltage applied to the drain region 176. For example, the STI region 140d may be configured to prevent or minimize hot carrier injection (HCI) into the oxide layer of the gate structure 120. The STI region 140d is disposed in the drift region 210 to form a field drift structure. The other STI regions 140a-c define active areas along the periphery of the core device area and the overall device area. The STI region 140c is disposed between the body contact region 170 that is connected to a connector 122, and an isolation contact region 174 outside of the core device area (marked as NLDMOS).

Additional, fewer, or alternative STI regions may be disposed in the semiconductor substrate 100 to isolate or separate various contact regions (e.g., 176, 172, 170, 174), as well as other regions such as the DTI 102. For example, the body contact region 170 and the source region 172 may be separated by an additional STI region.

The conduction path of the device 10 may be configured with one or more lightly or intermediately or heavily doped transition regions 215 (e.g., n-type lightly doped drain, or NLDD, regions) at or near the source and drain regions 172 and 176. Each transition region 215 may be or include a diffused region formed in connection with the source region 172. In this example, the device 10 includes an NLDD region 215 adjacent the source region 172.

When the gate structure 120 is biased, charge carriers (in this case, electrons; alternatively, holes) accumulate in one or more channel areas or regions 219. Each channel region 219 (or a portion thereof) may be formed in the body region 214 under the gate structure 120. In this example, the accumulation of electrons results in a charge inversion in the channel region 219 from the p-type of the body region 214 to an n-type conduction layer or area near the surface the semiconductor substrate 100. Once a sufficient amount of the charge carriers accumulate in the conduction layer or area, charge carriers are capable of flowing from the source region 172 toward the drain region 176 through the channel region 219.

The channel region 219 may include other regions or areas in the semiconductor substrate 100 in which charge inversion or accumulation occurs as a result of the bias applied to the gate structure 120. Charge carriers may also accumulate outside of or beyond the body region 214. For example, charge carriers may accumulate in a region of the epitaxial layer 24 between the body region 214 and the drift region 210, as well as in an accumulation region near the surface under the gate structure 120.

After exiting the channel region 219, the charge carriers drift through the drift region 210 to reach the drain region 176. The drift region 210 electrically couples the drain region 176 and the channel region 219. The drift region 210 may be configured to allow the charge carriers to drift under the electric field established by the drain-source voltage applied between the drain region 176 and the source region 172. In this example, the drift region 210 is an n-type well that laterally extends under the STI region 140d as a field drift region.

The drift region 210 may be configured to be depleted to reduce the magnitude of the electric field in areas in and/or around the drift region 210 via the reduced surface field (RESURF) effect to increase the voltage at which breakdown occurs along the conduction path of the device 10. In this example, the drift region 210 is depleted both laterally and vertically. A junction forms between the n-type well of the drift region 210 and the p-type epitaxial layer 24 and/or the body region 214 to establish a lateral RESURF effect. The junction is reverse-biased as a result of the application of a drain voltage Vds between the source region 172 and the drain region 176. The drift region 210 is also depleted vertically by a p-type buried well region 212 disposed under the drift region 176.

Further depletion in and around the drift region 210 may be achieved via a double RESURF arrangement in which a voltage is applied to the buried isolation layer 106 to reverse bias a junction between the buried isolation layer 106 and the buried well region 212. To that end, the device 10 includes a connector 130 (e.g., a patterned metal interconnect or a metal line) supported by the substrate 100 to electrically tie the drain region 176 to the isolation contact region 174. A voltage may be applied during operation to the buried isolation layer 106 via the other regions of the doped isolation barrier, in this case, the stacked isolation wells 110, 108 under the STI region 140c. The drain-source bias voltage may thus be used to bias the buried isolation layer 106.

However, the buried isolation layer 106 and other components of the doped isolation barrier are biased at a voltage level lower than the drain-source bias voltage (e.g., the voltage applied to the isolation contact region 174). The full drain-source bias voltage is not directly applied to the doped isolation barrier. Instead, the potential of the doped isolation barrier is instead partially lifted to the voltage level of the drain-source bias voltage to lower the voltage stress between the body region 214 and the doped isolation barrier (e.g., the buried isolation layer 106).

Such partial biasing of the doped isolation barrier is provided by depleted well regions including 252, 256 disposed in the semiconductor substrate 100 outside of the core device area. The depleted well regions 252, 256 electrically couple the isolation contact region 174 and the doped isolation barrier. A portion of the drain-source bias voltage is supported by the depleted well regions 252, 256, such that only part of the bias voltage reaches the doped isolation barrier. The doped isolation barrier may thus be biased at a voltage level lower than the voltage applied to the isolation contact region 174. In this example, the depleted well regions 252, 256 are n-type wells that extends between, and is in contact with, the isolation contact region 174 and the isolation well 110 under the STI 140c. In other embodiments, the depleted well regions 252, 256 may be laterally adjacent to additional and/or alternative regions or layers of the doped isolation barrier. As described below, the depleted well regions 252, 256 may be formed in conjunction with the drift region 210, thereby using a pre-existing implant(s).

The extent of the voltage drop across the depleted well region 78 may vary in accordance with the extent to which the depleted well regions 252, 256 are depleted of charge carriers. The depleted well regions 252, 256 may be partially or fully depleted of charge carriers. The extent to which the depleted well regions 252, 256 is depleted of charge carriers may be enhanced by one or more structures or other characteristics of the periphery of the device 10. The extent of the depletion may be enhanced both laterally and/or vertically, examples of which are described below.

In the embodiment of FIG. 1, the lateral depletion of the depleted well regions 252, 256 are enhanced through one or more gaps in the dopant implantation area for the depleted well regions 252, 256. The lateral extent of the depleted well regions 252, 256 are shown both before and after thermal diffusion (e.g., one or more post-implant dopant drives). Before thermal diffusion, the depleted well regions 252, 256 may or might not have an interior gap between the well 252 and the well 256. Thermal diffusion of the dopant of the depleted well regions 252, 256 may then fill in the interior gap, thereby lowering the dopant concentration level within an interior section or portion of the depleted well regions 252, 256. As a result, the depleted well regions 252, 256 may include an interior section that corresponds with the location of the interior gap that has a lower dopant concentration level than the well 252 and the well 256 adjacent the isolation contact region 174 and the isolation well 110 under the STI 140c of the doped isolation barrier, respectively. The lower dopant concentration level allows the interior section to be more easily depleted of charge carriers. As a result, a greater amount or degree of depletion of the depleted well regions 252, 256 may thus be achieved.

Further lateral depletion is provided at the outer edge of the depleted well regions 252, 256. The depleted well regions 252, 256 do not extend across the full lateral extent of the isolation contact region 174. The depleted well regions 252, 256 laterally overlap the isolation contact region 174 to establish the electrical coupling.

Depletion is accomplished in the vertical direction in the example of FIG. 1 through the presence of a p-type buried well regions 254, 258. The buried well regions 254, 258 are disposed under and in contact with the depleted well regions 252, 256. The depleted well regions 252, 256 may be thus be depleted from below in a manner similar to the way in which the drift region 210 is depleted by the buried well region 212.

Depletion in the vertical direction is also attained via a conductive flap 134 positioned over the depleted well regions 252, 256. The conductive flap 134 is biased during operation to deplete the depleted well regions 252, 256. In this n-channel example, the conductive flap 134 may be grounded or otherwise biased at a low voltage level relative to the drain-source bias voltage. Alternatively, the conductive flap 134 may also be tied to the source connector 122. As a result, the charge carriers (in this case, electrons) are pushed away from the surface of the substrate 100, thereby depleting the depleted well regions 252, 256 from above. The conductive flap 134 may include a polysilicon plate, one or more metal layers, or another conductive structure.

The conductive flap 134 may sits above the STI regions 140c or be spaced from the surface of the substrate 100 by one or more passivation layers 92. Any one or more dielectric materials may be used for the passivation layer(s) 92.

The formation of the above-described regions involved in the partial biasing of the doped isolation barrier may not increase the complexity or cost of fabricating the device 10. For instance, the same implants (and corresponding mask layers) may be used to form the peripheral regions involved in the partial biasing. The same implant may be used to form the depleted well regions 252, 256 and the drift region 210. The depleted well regions 252, 256 may thus have a dopant concentration profile in common with the drift region 210. The same implant may be used to form the buried well regions 258, 254 and 212. The buried well regions 258, 254 and 212 may thus have a common dopant concentration profile. Furthermore, in the example of FIG. 1, the n-type and p-type implants used to form these regions may be configured with the same mask, insofar as the layout of the n-type and p-type regions may be the same.

The edge regions are the isolation wells 110, 108 (under the STI 140b) and the buried layer 106 (under the STI 140b). These edge regions are disposed along the inner edge of the ring-shaped DTI region 102 to act as a doped edge isolation barrier that protects against breakdown across the DTI region 102. The partial biasing of these edge regions may be used to avoid the high voltage stress that would otherwise occur if the edge regions were biased at the full drain-source bias voltage. To that end, the device 10 includes a depleted edge well regions 262, 266. The depleted edge well regions 262, 266 and the depleted well regions 252, 256 may be configured similarly. The depleted edge well regions 262, 266 electrically couples the isolation contact region 174 and the regions of the doped edge isolation barrier. As a result, the doped edge isolation barrier is biased at a lower voltage level than the voltage applied to the isolation contact region 174.

The partial biasing of the edge regions along the DTI region 102 may be greater, less than, or equal to the partial biasing of the doped isolation barrier. In the example of FIG. 1, the depleted well regions 252, 256 and the depleted edge well regions 262, 266 are laterally symmetrical about the isolation contact region 174. The same extent of depletion of the depleted edge well regions 262, 266 may thus be attained laterally via the same gaps (as described above) and vertically through a buried edge well regions 264, 268 and a further conductive flap 135. The edge regions of the doped edge isolation barrier may thus be biased at the same level as the regions of the other doped isolation barrier. In other cases, the partial biasing may differ if, for instance, the depleted well regions are not symmetrical (e.g., one may be wider than the other) and/or further depletion is not attained via, for instance, a conductive flap. The voltage level of the doped isolation barriers may thus be adjusted independently of one another.

The partial biasing of the doped isolation barriers may also be supported by the absence of the buried isolation layer 106. In the example of FIG. 1, the gap 132 in the buried isolation layer 106 is positioned such that the buried isolation layer 106 does not extend under the depleted well regions 252, 256, 262, 266 outside of the core device area. In this way, the biasing of the buried isolation layer 106 occurs via the lateral path involving, for instance, the depleted well regions 252, 256 and the isolation wells 110, 108 (under the STI 140*c*), rather than, for instance, a more direct vertical path to the isolation contact region 174. The width of the gap 132 may be altered to tune the potential of the buried isolation layer 106.

FIG. 1 depicts the device 10 in simplified form in the sense that only one side of the device 10 is shown. The device 10 may include another side configured in a manner similar to the depicted side. For example, the other side of the device 10 may mirror or match the depicted side, such that the device 10 is symmetrical about the drain region 176. The drain region 176 may thus be disposed in the center (or along a central line) of the device 10. The other side may thus include a second source region 172 separated from the drain region 176 by a second gate structure 120. In some embodiments, the second source region 172 and the second gate structure 120 are contiguously formed with the corresponding regions of the device 10 described above via one or more connecting structures offset from the lateral cross-section shown in FIG. 1. For example, the gate structure 120 may be U-shaped or arch-shaped (e.g., a single lateral connection) or toroidal or looped (e.g., two lateral connections) when viewed from above. The shapes of the above-described regions of the device 10 may vary considerably from these examples.

In some scenarios, the source 172, the gate 120 may be biased with a negative potential with the isolation ring formed by regions of 110, 108, and 106 floating during a circuit switching period. In this scenario, a relatively large substrate current is sensed due to a high current gain of parasitic pnp bipolar transistor formed by the p-type substrate 100, n-type isolation ring 110, 108, 106 and the p-type body region. A high beta of the parasitic pnp bipolar transistor may be attributed to a weak link with a low dopant concentration between the well 108 and the buried isolation layer 106.

Figure 2:
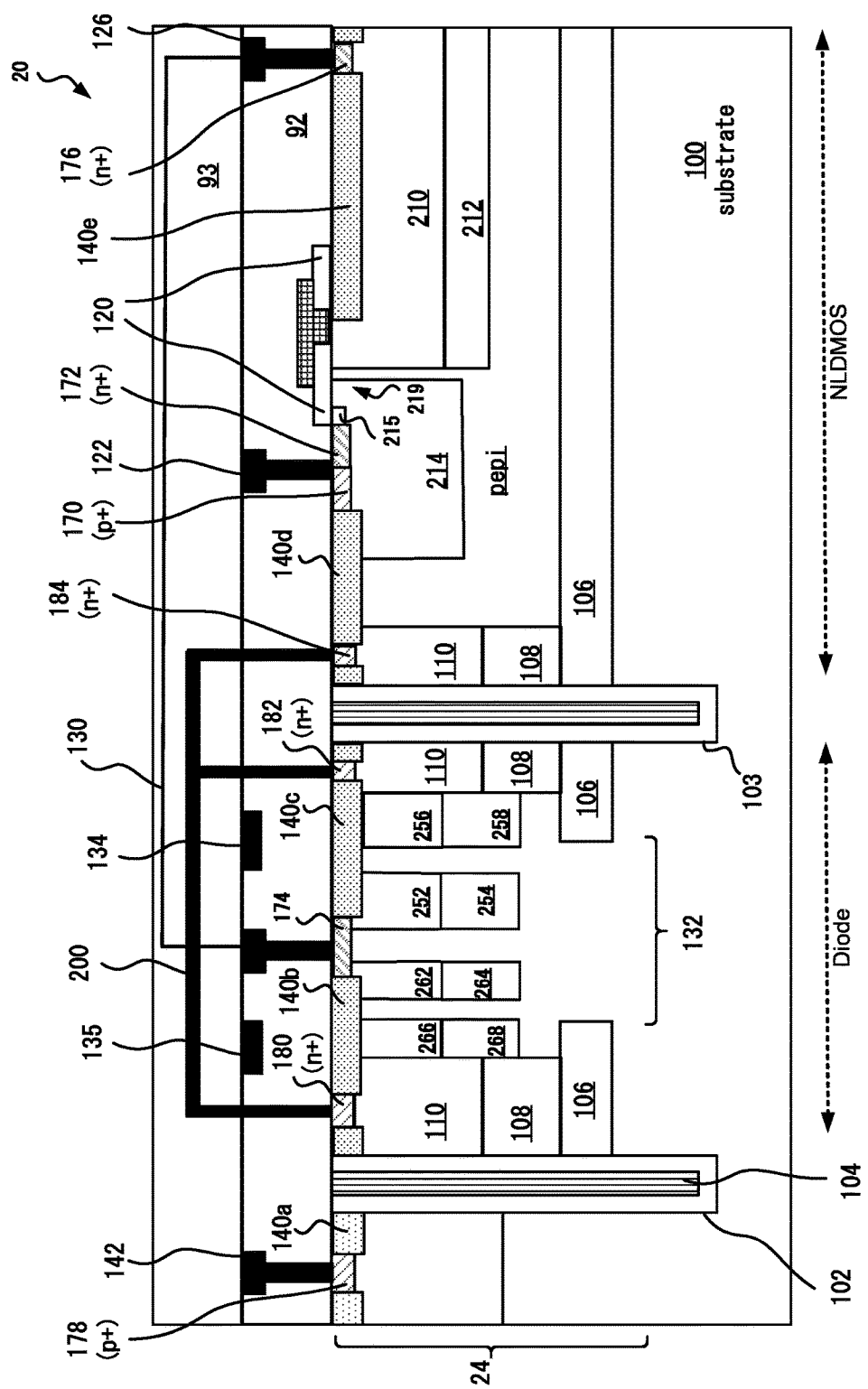
FIG. 2 depicts a schematic of an improved n-channel LDMOS (NLDMOS) in accordance with one or more embodiments of the present disclosure.

FIG. 2 illustrates a device 20 which is similar in structure to the device 10 of FIG. 1. However, certain structure has been added to reduce relatively large substrate current when the source 172, the gate 120 are biased with a negative potential with the isolation ring floating.

Primary differences between the device 10 of FIG. 1 and the device 20 of FIG. 2 include inclusion of heavily doped sections 180, 182, 184. These heavily doped sections 180, 182, 184 may be formed along with the drain 176, the source 172 and the isolation contact region 174 using the same dopant concentration. An interconnect or a metal line 200 connects the sections 180, 182 and 184 to bring their potential at a same level. This interconnect or metal line 200 may be formed on top of the passivation layer 92. In some embodiments, a second passivation layer 93 may be disposed on the passivation layer 92 and the electrical connection or the metal line 200 may be disposed within the second passivation layer 93. The STI sections 140*a-d* of the device 10 of FIG. 1 are reconfigured into 140*a-e*, as shown in FIG. 2. The isolation wells 110, 108 under the STI 140*c* in FIG. 1 have been split to add a second DTI 103 which is formed in the same or similar way of the formation of the DTI 102. The second DTI 103 is to isolate the core device from the diode on the left side to prevent or significantly reduces current gain of the parasitic transistor (formed by p-substrate/isolation ring 110, 108, 106/p-body). The connector 200 leads to a more uniform distribution of electro-potential among the n-type isolation ring 110, 108, 106 for the core device.

Figure 3:
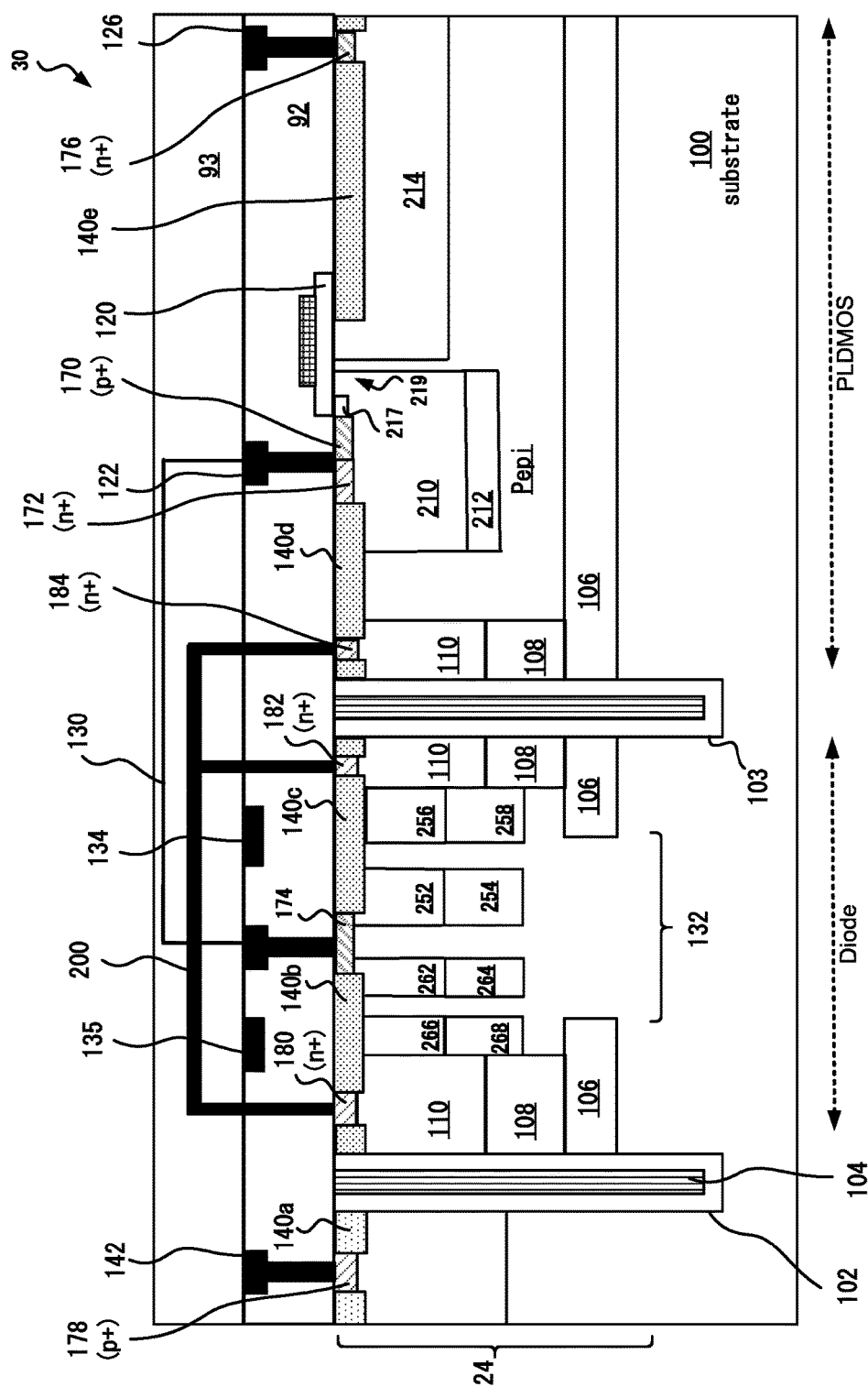
FIG. 3 depicts a schematic of an improved p-channel LDMOS (PLDMOS) in accordance with one or more embodiments of the present disclosure.

FIG. 3 illustrates the device 30 which is a p-type version of the device 20. For easy understanding, element numbers of FIG. 2 have been retained. However, some elements such as the contact region 170 and the drain regions 172, 176 have been reconfigured from n-type to p-type. The isolation ring 130 now connects the connector 122 with the isolation contact region 174. The locations of the body region 214 and the drift region 210 changes accordingly. In other words, FIG. 3 depicts a p-type transistor while FIG. 2 depicts a n-type transistor. A person skilled in the art would know necessary structural differences in various layers of an n-channel and a p-channel transistor.

FIGS. 4*a-g* illustrate relative locations of the diode with respect to the core device. It may be noted that in some embodiments, the second DTI 103 will surround the entire core device. Various alternative locations of the diode with respect to the core device (marked as NLDMOS/PLDMOS) are possible depending upon physical design considerations for optimal use of the silicon area 100.

Figure 5:
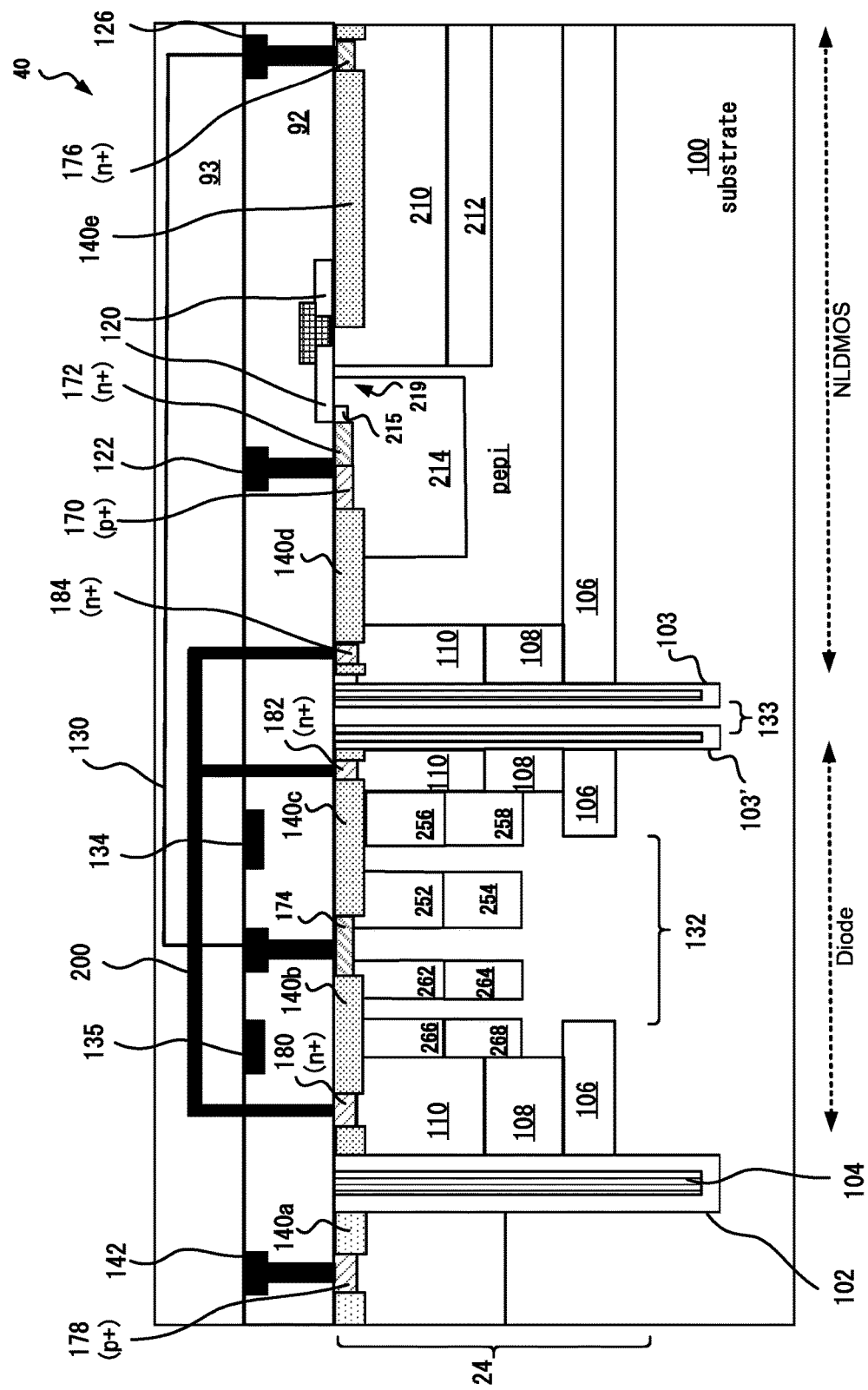
FIG. 5 depicts a schematic of an improved NLDMOS device having two isolation trenches in accordance with one or more embodiments of the present disclosure.

FIG. 5 illustrates the device 40 which is similar the device 20, hence the same description applies for the device 40. The device 40 includes another DTI region 103' next to the DTI 103. The DTI 103' surrounds the DTI 103 such that there is a space 133 between an outer wall of the DTI 103 and an inner wall of the DTI 103'. There is the space 133 between the two DTIs 103, 103'. The gap 133 may be used to accommodate other circuit components and the width of the gap 133 may be varied according to design consideration.

Some or all of these embodiments may be combined, some may be omitted altogether, and additional process steps can be added while still achieving the products described herein. Thus, the subject matter described herein can be embodied in many different variations, and all such variations are contemplated to be within the scope of what is claimed.

While one or more implementations have been described by way of example and in terms of the specific embodiments, it is to be understood that one or more implementations are not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims as set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

Preferred embodiments are described herein, including the best mode known to the inventor for carrying out the claimed subject matter. Of course, variations of those preferred embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

What is claimed is:

1. A device comprising:
   a semiconductor substrate;
   a core device formed in the semiconductor substrate;
   a first deep trench isolation barrier surrounding the core device;
   a secondary device formed in the semiconductor substrate outside the deep trench isolation barrier; and
   a second deep trench isolation barrier formed to isolate the secondary device from remaining part of the semiconductor substrate, wherein a first portion of the secondary device is electrically connected to a first portion of the core device through a first electrical connector and a second portion of the secondary device is electrically connected to a second portion of the core device through a second electrical connector.

2. The device of claim 1, wherein a passivation layer is disposed over a top surface of the semiconductor substrate.

3. The device of claim 2, wherein the first electrical connector and the second electrical connector are disposed over within the passivation layer.

4. The device of claim 1, wherein a doped isolation barrier is disposed on a first and a second sides of the first deep trench isolation barrier.

5. The device of claim 4, wherein the doped isolation barrier includes a first doped isolation barrier disposed on the first side of the first deep trench isolation barrier and a second doped isolation barrier disposed on the second side of the first deep trench isolation barrier.

6. The device of claim 5, wherein the first doped isolation barrier and the second doped isolation barrier are electrically connected through the first electrical connector.

7. The device of claim 5, wherein a third doped isolation barrier is formed on one side of the second deep trench isolation barrier.

8. The device of claim 7, wherein the third doped isolation barrier is connected to the second doped isolation barrier through the first electrical connector.

9. The device of claim 1, wherein the secondary device is disposed such that the secondary device surrounds the core device in all sides.

10. The device of claim 1, wherein the secondary device includes a first part and a second part, wherein the first part is disposed on a first side of the core device and the second part is disposed on a second side of the core device.

11. The device of claim 1, wherein the secondary device is disposed on one side the secondary device.

12. The device of claim 1, further including a third deep trench isolation barrier surrounding the first deep trench isolation barrier such that there is a space between an outer wall of the first deep trench isolation barrier and an inner wall of the third deep trench isolation barrier.

13. The device of claim 1, wherein the secondary device includes a first part, a second part and a third part, wherein the first part is disposed on a first side of the core device, the second part is disposed on a second side of the core device and the third part is disposed on a third side of the core device.

14. A device comprising:
   a semiconductor substrate;
   a doped isolation barrier disposed in the semiconductor substrate and defining a core device area within the doped isolation barrier;
   an isolation contact region disposed in the semiconductor substrate outside of the core device area and to which a voltage is applied during operation;
   a depleted well region disposed in the semiconductor substrate outside of the core device area, the depleted well region electrically coupling the isolation contact region and the doped isolation barrier such that the doped isolation barrier is biased at a voltage level lower than the voltage applied to the isolation contact region; and
   wherein the doped isolation barrier includes a first doped isolation barrier and a second isolation barrier separated by a core deep trench isolation region, wherein the first doped isolation barrier and the second isolation barrier are electrically connected using a metal line disposed over a surface of the semiconductor substrate.

15. The device of claim 14, further comprising a conductive flap supported by the semiconductor substrate and positioned over the depleted well region, the conductive flap being biased during operation to deplete the depleted well region.

16. The device of claim 14, wherein the depleted well region comprises a pair of exterior sections adjacent the isolation contact region and the doped isolation barrier, and an interior section disposed between the exterior sections.

17. The device of claim 14, further comprising:
   a body region disposed in the semiconductor substrate within the core device area, having a first conductivity type, and in which a channel is formed during operation;
   a drift region disposed in the semiconductor substrate within the core device area, having a second conductivity type, and through which charge carriers drift during operation after exiting the channel;
   wherein the depleted well region has a dopant concentration profile in common with either the body region or the drift region.

18. The device of claim 14, further comprising a second core deep trench isolation region such that there is a space between the second core deep trench isolation region and the core deep trench isolation region.

19. The device of claim 18, further comprising:
- a body region disposed in the semiconductor substrate within the core device area, having a first conductivity type, and in which a channel is formed during operation;
- a drift region disposed in the semiconductor substrate within the core device area, having a second conductivity type, and through which charge carriers drift during operation after exiting the channel;
- a further buried well region disposed in the semiconductor substrate under and in contact with the drift region, having the first conductivity type, and configured to deplete the drift region;
- wherein the depleted well region and the drift region have a common dopant concentration profile; and
- wherein the buried well region and the further buried well region have a common dopant concentration profile.

20. The device of claim 14, wherein the depleted well region does not extend across an entire lateral extent of the isolation contact region.

\* \* \* \* \*